United States Patent [19]

Vested

[11] 4,200,044

[45] Apr. 29, 1980

[54] METHOD AND APPARATUS FOR GRAVURE PRINTING THAT INCLUDES LINE WORK

[76] Inventor: Harry S. Vested, R.R. South, Mount Morris, Ill. 61054

[21] Appl. No.: 872,546

[22] Filed: Jan. 26, 1978

Related U.S. Application Data

[63] Continuation-in-part of Ser. No. 741,045, Nov. 11, 1976, abandoned.

[51] Int. Cl.$^2$ .................. B41M 1/10; B41M 9/06; B41N 1/06
[52] U.S. Cl. .................. 101/170; 101/395; 101/401.1
[58] Field of Search ............ 101/401.1, 170, 395; 96/35, 36, 36.3, 38

[56] References Cited

U.S. PATENT DOCUMENTS

| | | | |
|---|---|---|---|
| 2,039,195 | 4/1936 | Stirling | 101/401.1 |
| 2,456,608 | 12/1948 | Alger | 101/399 |

OTHER PUBLICATIONS

Rotogravure, "A Survey of European and American Methods," H. M. Cartwright & R. MacKay, MacKay Publ. Co. Inc., Lyndon, Kentucky, 1956.

*Primary Examiner*—J. Reed Fisher
*Attorney, Agent, or Firm*—Leydig, Voit, Osann, Mayer & Holt, Ltd.

[57] ABSTRACT

An improved gravure printing method and apparatus is disclosed which is particularly useful in gravure printing operations which involve both tonal work and line work. The tonal work image on the gravure printing surface is engraved to form a multiplicity of varying depth ink wells separated by a grid of doctor-blade supports spaced to provide a high degree of resolution of the tonal work. The line work image of the gravure printing surface is engraved to form a multiplicity of ink wells all similar in depth and shallower in depth than at least some of the ink wells in the tonal work. These ink wells are separated by a grid of doctor-blade supports spaced with a centerline-to-centerline spacing substantially greater than the spacing of the doctor-blade supports for the tonal work to provide only a small number of intersections between the doctor-blade supports and the edges of the printed line work, thereby improving the continuity and smoothness of the edges of the printed line work. Prior to engraving the ink wells, the doctor-blade-support areas in the line work image have a substantially smaller width than the doctor-blade-support areas in the tonal work image, which also improves the continuity of the edges of the printed line work and reduces the various spans between adjacent ink wells in the line work image. In the preferred embodiment of the invention, the ink wells in the line work image having a greater surface area relative to the surface area of the doctor-blade supports, and are engraved more shallow than the ink wells in regions of similar hue in the tonal work image.

36 Claims, 12 Drawing Figures

(a) (a) (a)
(b) (b) (b)

fig. 1.
SOLID CHARACTER fig. 2.
150 LINES / INCH
S:W = 1:3
55.7% COPY IMAGE fig. 3.
75 LINES / INCH
S:W = 1:6.9
76.2% COPY IMAGE (a) (a) (a)
(b) (b) (b)

fig. 4.
75 LINES / INCH
S:W = 1:10.2
82.9% COPY IMAGE fig. 5.
75 LINES / INCH
S:W = 1:18.1
89.8% COPY IMAGE fig. 6.
150 LINES / INCH
S:W = 1:11.7
80.2% COPY IMAGE

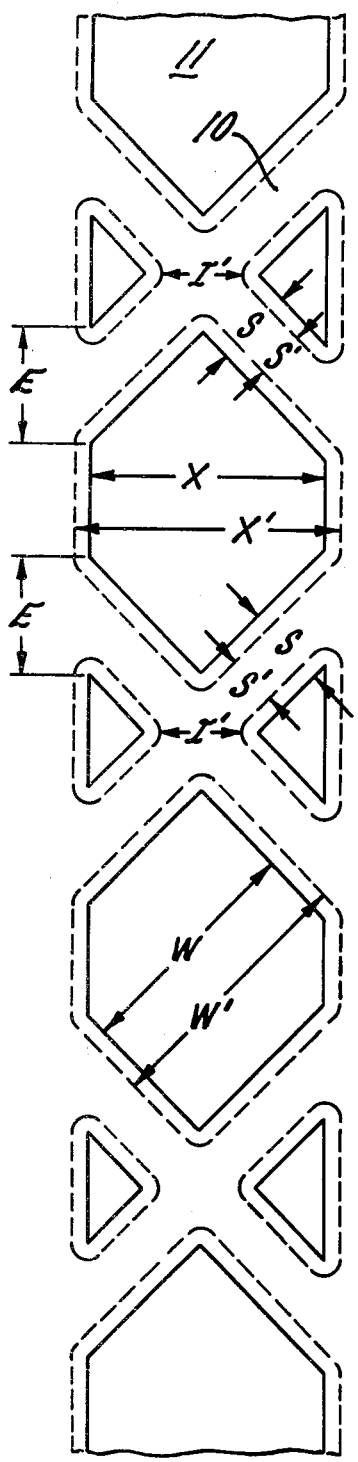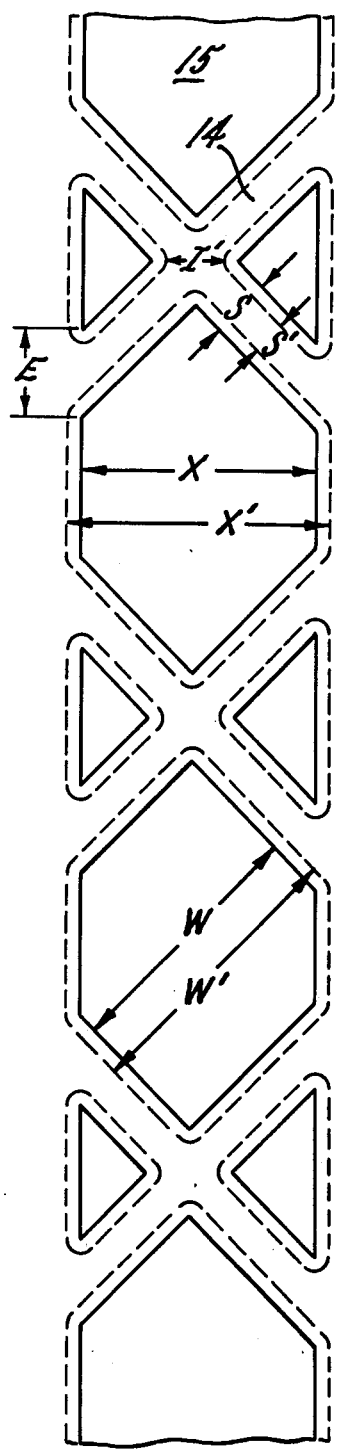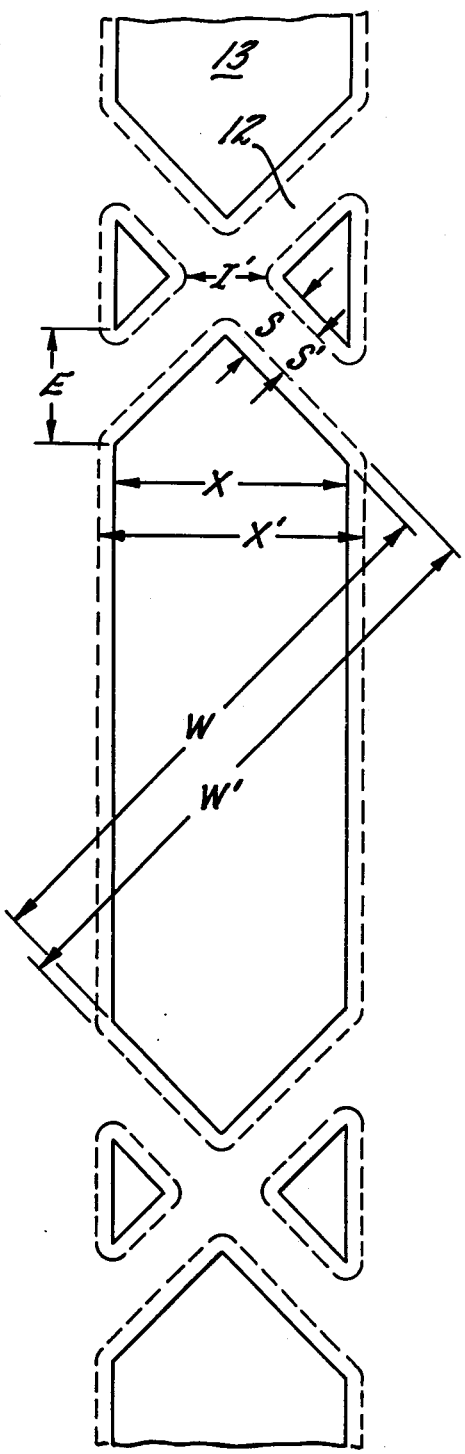
Fig. 7.
150 LINES/INCH
S:W = 1:3
Fig. 8.
150 LINES/INCH
S:W = 1:4.2
Fig. 9.
75 LINES/INCH
S:W = 1:6.9

75 LINES / INCH
S:W = 1:10.2

75 LINES / INCH
S:W = 1:18.1

150 LINES / INCH
S:W = 1:11.7

METHOD AND APPARATUS FOR GRAVURE PRINTING THAT INCLUDES LINE WORK

CROSS REFERENCE TO RELATED APPLICATION

This application is a continuation-in-part of application Ser. No. 741,045, now abandoned, filed Nov. 11, 1976 and entitled "Method And Apparatus For Gravure Printing That Includes Line Work."

DESCRIPTION OF THE INVENTION

The present invention relates generally to gravure printing and, more particularly, to an improved method and apparatus for gravure printing reproductions of copy containing both tonal work and line work.

The rotogravure process for many decades has permitted printers to produce higher quality tonal reproductions on lesser grades and lesser basis weights of paper (and other substrates) and at greater speeds than other printing processes. These attributes of the rotogravure process filled the needs of publishers of larger quantity pictorial pieces, originally in only a single ink color and then later in multi-colored inks.

However, the rotorgravure process has generally produced lower quality than the other printing processes in line work, such as text type, line drawings and the like. This lower quality in the line work was accepted by the publishers because of the other attributes of the rotogravure process, but only because no alternative was offered for improving the quality of the line work. At the present time, more publishers of quality-conscious magazines are using or planning to use the economical, high quality tonal reproductions offered by the gravure process, but these publishers are also demanding higher quality text type and other fine line reproductions from the gravure process.

The craftsmen of the graphic arts have traditionally used finer screens (or finer scanning lines) to obtain sharper resolution of tonal reproductions. This thinking has been followed consistently in the gravure industry throughout the improvement years of single and multi-color tonal reproductions. For tonal printing, the aim of the effort is properly directed. Each small tonal variation relates to adjacent tonal variations to create a smooth optical appearance of highlights, middletones and shadows, and in general the definition of the tonal subject increases with increasing fineness of the ink-well elements. Due to migration of ink in the gravure process and the relatively large areas involved in tonal reproduction, the doctor-blade supports formed by the fine screens tend to disappear into the reproduction and the generated uneven, serrated edges do not significantly disrupt the total effect of the tonal reproduction. However, the interruptions caused by the doctor-blade supports in the printed reproduction become much more objectionable in the narrower areas of line work.

It is, therefore, a principal object of the present invention to provide an improved gravure printing method and apparatus that improves the continuity of the edges of the printed line work in reproductions containing both tonal work and line work. In this connection, a related object of the invention is to provide such an improved gravure printing method and apparatus that also maintains a high degree of resolution in the tonal work.

Yet another significant object of the invention is to provide such an improved gravure printing method and apparatus that increases the ratio of ink-well area to doctor-blade-support area in the engraving control material and ultimately in the printing plate particularly for the reproduction of finer line work.

Another important object of the invention is to provide an improved gravure printing method and apparatus of the foregoing type that offers significant economic advantages, particularly in savings of ink. Thus, one specific object of the invention is to provide an improved gravure printing method and apparatus that permits the use of greater area and shallower depth ink wells which not only reduce the amount of ink required, but also utilize the reduced lateral etching around the perimeters of the ink wells including those shaping the image.

A further object of the invention is to provide such an improved gravure printing method and apparatus that reduces unwanted migration of ink beyond the edges of the ink wells in the printing surface, thereby improving the sharpness of the printed reproduction.

Other objects and advantages of the invention will be apparent from the following detailed description and the accompanying drawings, in which:

FIG. 1(a) is an enlarged upper case "W" and FIG. 1(b) is an enlarged lower case "e", representing the ideal form to be achieved for these letters in a printing operation;

FIGS. 2(a) and (b) show the same enlarged letters illustrated in FIG. 1 overlaid with a grid of doctor-blade-support areas at a spacing of 150 lines per inch, with a to-be-engraved doctor-blade-support area width/ink-well area width ratio of 1:3, and with a potential copy image transfer of 55.7%;

FIGS. 3(a) and (b) show the same letters illustrated in FIG. 1 overlaid with a grid of doctor-blade-support areas at a spacing of 75 lines per inch, with a to-be-engraved support-area width/well-area width ratio of 1:6.9, and with a potential copy image transfer of 76.2%;

FIGS. 4(a) and (b) show the same letters illustrated in FIG. 1 overlaid with a grid of doctor-blade-support areas at a spacing of 75 lines per inch, with a to-be-engraved support-area width/well-area width ratio of 1:10.2, and with a potential copy image transfer of 82.9%;

FIGS. 5(a) and (b) show the same letters illustrated in FIG. 1 overlaid with a grid of doctor-blade-support areas at a spacing of 75 lines per inch, with a to-be-engraved support-area width/well-area width ratio of 1:18.1, and with a potential copy image transfer of 89.8%;

FIGS. 6(a) and (b) show the same letters illustrated in FIG. 1 overlaid with a grid of doctor-blade-support areas at a spacing of 150 lines per inch, with a to-be-engraved support-area width/well-area width ratio of 1:11.7, and with a potential copy image transfer of 80.2%;

FIG. 7 is an enlarged fragmentary view of a gravure printing surface with a grid of doctor-blade supports corresponding to the pattern shown in FIG. 2, and with the portions of the printing surface engraved by lateral etching shown by broken lines;

FIG. 8 is an enlarged fragmentary view of a gravure printing surface with the spacing of the grid of doctor-blade supports shown in FIG. 7 but with the support area width (S) adjusted to utilize lesser depth engraving and the corresponding lesser lateral etching available for reproduction improvement, and with the portions of the printing surface engraved by lateral etching shown by broken lines;

FIG. 9 is an enlarged fragmentary view of a gravure printing surface with a grid of doctor-blade supports corresponding to the pattern shown in FIG. 3, and with the portions of the printing surface engraved by lateral etching shown by broken lines;

Figures 10, 11, 12:
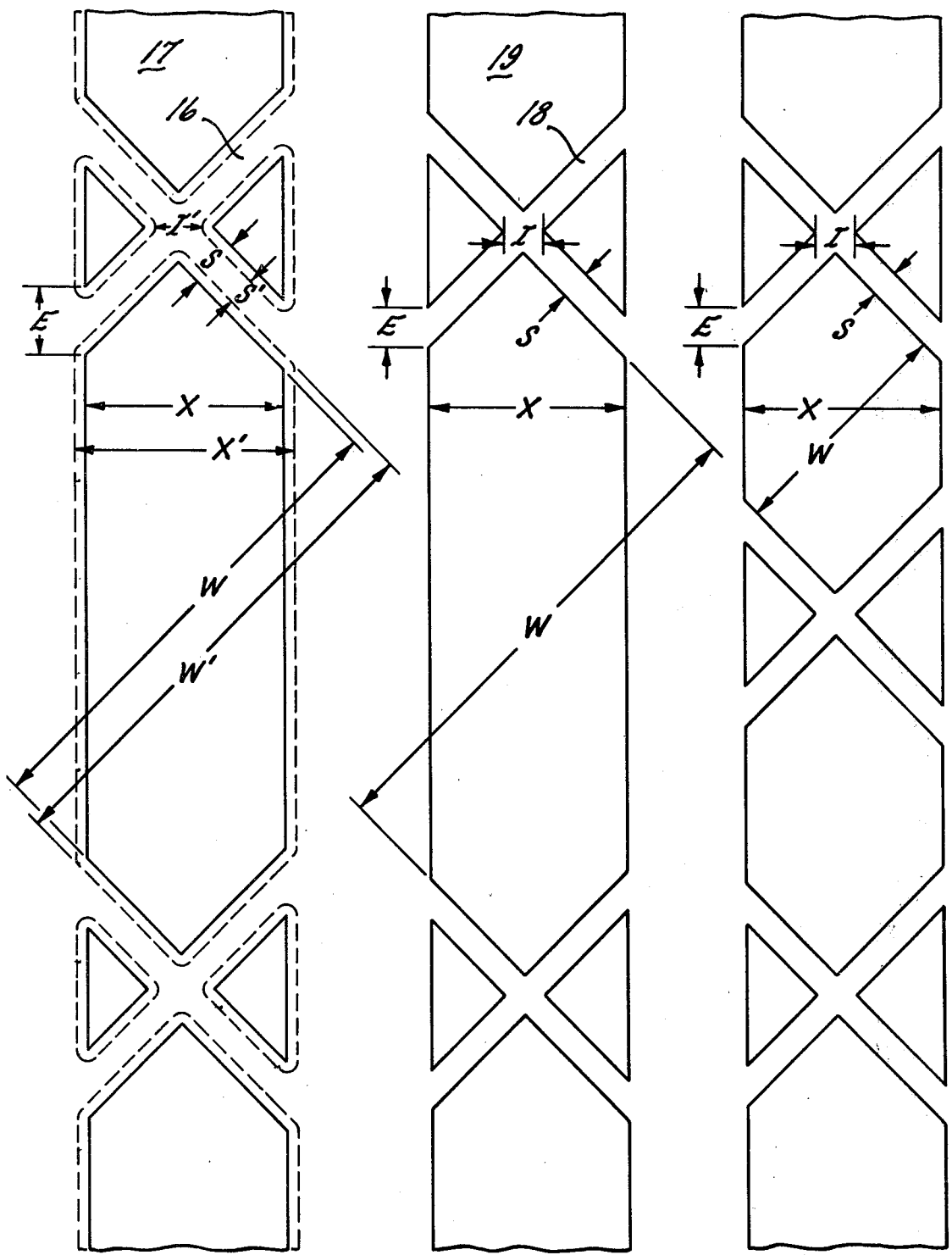
FIG. 10 is an enlarged fragmentary view of a gravure printing surface with a grid of doctor-blade supports corresponding to the pattern shown in FIG. 4, and with the portions of the printing surface engraved by lateral etching shown by broken lines.
FIG. 11 is an enlarged fragmentary view of a portion of a gravure printing surface with a grid of doctor-blade supports corresponding to the pattern illustrated in FIG. 5.
FIG. 12 is an enlarged fragmentary view of a portion of a gravure printing surface with a grid of doctor-blade supports corresponding to the pattern illustrated in FIG. 6.

Although the invention will be described in connection with certain preferred embodiments, it will be understood that it is not intended to limit the invention to these particular embodiments. On the contrary, it is intended to cover all alternatives, modifications and equivalents that may be included within the spirit and scope of the invention as defined by the appended claims.

Turning now to the drawings and referring first to FIG. 1, there is shown an upper case "W" (FIG. 1(a)) and a lower case "e" (FIG. 1(b)) in solid form with smooth continuous edges, sharp corners, and a uniform density, which is the ideal reproduced form for these letters in a printing operation. However, because of the necessity for doctor-blade supports within each letter in a gravure printing surface (which printing surface may take the form of either a cylinder or a flat plate), the ideal forms illustrated in FIG. 1 are never achieved by gravure printing in actual practice. Thus, as illustrated in FIGS. 2 and 7, a grid of doctor-blade supports 10 (FIG. 7) typically divides each letter area on an engraved gravure surface into a multiplicity of small discrete ink wells 11. It can be seen that the doctor-blade supports 10 repeatedly intersect the edges of each letter area, thereby interrupting the continuity of the edges of the letter areas. Although the ink from the wells 11 migrates over the doctor-blade supports during the printing of the letters, the ink naturally migrates from the periphery of each well, thereby resulting in a notch or recess in each letter edge at each point where a doctor-blade support intersects an edge of the printed letter; this produces a serrated or scalloped edge on the printed letter which gives it a fuzzy appearance to the reader, rather than the desired sharp, distinct impression illustrated by the letters in FIG. 1.

In a typical gravure printing preparation operation, the doctor-blade-support areas on the gravure surface are sufficiently wide to withstand the lateral etching that normally occurs during the depth engraving of any of the ink wells. In general, the extent of the lateral etching increases with the depth of the etching; for example, each 0.001 inch of depth etching in a well typically produces about 0.00035 inch of lateral etching around the entire periphery of the well (a total increase of about 0.0007" in the well width). The depths of the ink wells are usually varied throughout any gravure printing plate, with the deepest wells being produced in those portions of the tonal work image where the deepest hues (commonly referred to as "shadows") are desired. Wells of medium depth are produced in the "middletone" regions of the tonal work image and the most shallow wells are produced in the "highlight" regions of the tonal work image. In the line work image, the ink wells generally have a depth between the depths of the wells in the "middletone" and "shadow" regions of the tonal work image. The width of the doctor-blade-support areas is generally uniform across the entire to-be-engraved printing surface, being wide enough to withstand the lateral etching from the deepest wells and still provide a support that is wide enough to support the doctor blade as it wipes across the printing surface. In the line work image, where less lateral etching occurs, the doctor-blade supports remain relatively wide in the etched surface, requiring extra well depth just to provide the amount of ink needed to migrate across or "print over" the doctor-blade supports.

It should be emphasized that the grids of doctor-blade-support areas shown in FIGS. 2–6 represent the grids that are formed on the printing surface before engraving of the ink wells. In FIGS. 7–10 the doctor-blade-support areas prior to engraving are shown by the solid lines, while the broken lines show the resulting reduced widths of the doctor-blade supports after engraving.

Referring to FIG. 7, it can be seen that the original unetched width S of the doctor-blade-support areas is reduced to a substantially narrower width S' of the doctor-blade support by the lateral etching. However, due to the rounding of the corners of the ink wells that occurs during engraving, the width of the doctor-blade supports increases wherever the supports intersect with each other or with the edge of the image to be printed. Thus, the maximum width of the doctor-blade supports at each intersection with the edge of the image to be printed remains relatively large, both because of the rounding of the corners of the ink wells at the intersection and because the edge of the image to be printed often intersects the doctor-blade-support areas on a diagonal. Similarly, the width I' of the doctor-blade supports where they intersect each other within the body of the image to be printed also remains relatively large, again both because of the rounding of the corners of the ink-wells at the intersections and because the line between certain pairs of opposed ink-well corners extends diagonally rather than perpendicularly across the doctor-blade supports. Consequently, it can be seen that even after the engraving operation, there are still some relatively wide spans across which the ink must migrate during the printing operation, thereby requiring extra depth in the ink wells to contain the amount of extra ink required to spread across the widest spans of the doctor-blade supports.

Even when adequate ink is present to migrate across the maximum widths of the doctor-blade supports, an indentation or recess will obviously be formed in the edge of the printed reproduction at each intersection between a doctor-blade support and the edge of the image to be printed because the ink migrates outwardly from each ink well. Furthermore, surface tension also prevents the ink itself from flowing into and out of the corners of the ink wells, e.g., at the extremities of the edge intersections, as freely as it does along the side walls of the ink wells.

Exemplary dimensions for the grid pattern illustrated in FIGS. 2 and 7, using a screen with 150 lines/inch and a S:W ratio of 1:3, are as follows:

|  | 1:3 Screen | Engraved Cylinder | Net Changes |
| --- | --- | --- | --- |
| Well Width | 0.0050" (W) | 0.0057" (W') | 0.0007" |
| Support Width | 0.0017" (S) | 0.0010" (S') | 0.0007" |
| Well Depth | — | 0.0010" | 0.0010" |
| Edge Span | 0.0024" (E) | — | — |
| Internal Span | 0.0024" (I) | 0.0017" (I') | 0.0007" |
| Image Width | 0.0050" (X) | 0.0057" (X') | 0.0007" |

With the above dimensions, the unengraved ink-well areas in FIGS. 2 and 7 cover only about 55.7% of the copy image area, with the remainder being occupied by the grid of doctor-blade-support areas, and the final engraved ink wells cover only about 72.4% of the copy image area.

In accordance with one important aspect of the present invention, the line work image on the gravure printing surface is provided with a grid of doctor-blade-support areas having a centerline-to-centerline spacing substantially greater than the centerline-to-centerline spacing of the doctor-blade-support areas for the tonal work image to provide only a small number of intersections between the doctor-blade-support areas and the edges of the line work image, thereby improving the continuity and smoothness of the edges of the copy image transfer and ultimately of the printed line work. Thus, in the illustrative embodiment of FIGS. 3 and 9, the grid of doctor-blade supports 12 has a spacing of 75 lines per inch, as opposed to the 150 lines per inch used in the grid of FIGS. 2 and 7 and in the tonal work areas (not shown) of the printing surface of FIGS. 3 and 9. The use of this wider spacing, with the same support-area width S, more than doubles the width W of the ink-well areas and greatly reduces the number of intersections between the doctor-blade supports 12 and the edges of the line work image, thereby providing a significant improvement in the continuity and smoothness of the edges of the printed line work. The number of internal intersections between intersecting doctor-blade supports is also greatly reduced, thereby reducing the number of wide spans that will have to be "printed over" within the printed reproduction to achieve the desired solid printed letters. Furthermore, because of the reduced number of grid lines, there is less possibility of a corner of the copy image being cut off or rounded by accidental registration of a doctor-blade-support area therewith.

In the particular grid pattern illustrated in FIGS. 3 and 9, the only dimensions that are different from those given above for FIGS. 2 and 7 are W and W', which are 0.0117" and 0.0124" instead of 0.0050" and 0.0057', respectively. As can be clearly seen from a comparison of FIGS. 2 and 3, and FIGS. 7 and 9, these increases in W and W' lead to a considerable reduction in the number of points where the ideal letter forms (FIG. 1) are interrupted. With these dimensions, the S:W ratio is 1:6.9, the unengraved ink-well areas cover 76.2% of the copy image area, and the final engraved ink wells 13 cover about 85.6% of the copy image area.

In accordance with another important aspect of the invention, the unengraved doctor-blade-support areas in the line work image on the gravure surface (where the ink wells are to be engraved to a shallower depth than at least certain of the ink wells in the tonal work image) are formed with a substantially narrower width than the unengraved doctor-blade-support areas in the tonal work image. Thus, in the illustrative embodiment of FIGS. 4, 8 and 10, the ink wells 15 are engraved to a shallower depth than the ink wells in FIGS. 7 and 9 and in regions of comparable hue in the tonal work images (which are not shown in the drawing). This more shallow depth of the ink wells in the line work image is desirable because a smaller amount of ink is required in the printing of line work than in the printing of some tonal work, due to the deeper hues required in the shadow regions of the tonal work. The use of different etching depths in the tonal and line work images is conventional practice in the art of gravure printing and does not represent a novel feature of the present invention. However, the present invention takes advantage of the reduced lateral etching produced by the more shallow etching in the line work image to reduce the width S of the initial doctor-blade-support areas and the width S' of the final doctor-blade supports 14.

Furthermore, when S and S' are reduced, the ink-well depth in the line work image can also be reduced even more than it is normally reduced when the same grid pattern is used in both the tonal and line work images. This depth reduction permits an even greater reduction in the support-area width S by reducing the lateral etching, while at the same time reducing the ink requirements, and thus the cost, of the line work. Of course, the further reduction in S also reduces the maximum edge intersection span E, producing even smoother and more continuous edges on the printed line work.

In the embodiments of FIGS. 4, 8 and 10, both the initial unetched support width S and the final etched support width S' are significantly more narrow than the corresponding widths S and S' in the grid patterns used in the line work images of FIGS. 2, 3, 7 and 9 and in at least portions of the tonal work images (not shown) in the printing surfaces of FIGS. 4, 8 and 10. For example, whereas the exemplary widths S and S' given above for the grid patterns shown in FIGS. 2, 3, 7 and 9 are 0.0017" and 0.0010", the corresponding widths S and S' of the pattern illustrated in FIGS. 4, 8 and 10 are considerably smaller.

Thus, in FIG. 8, S and S' are only 0.0013" (a reduction of 23.5%) and 0.0007" (a reduction of 30.0%) which increases W to 0.0054" (FIG. 7 is 0.0050") and W' to 0.0060" (from 0.0057"), and provides an S:W ratio of 1:4.2 with the unengraved ink-well areas covering 65% of the copy image area. The final engraved ink wells will cover about 80.2% of the copy image area. The depth of etching is reduced to 0.0009" (from 0.0010").

In FIGS. 4 and 10, S and S' are only 0.0012" (a reduction of 29.4%) and 0.0007" (a reduction of 30.0%) which increases W to 0.0122" (FIG. 9 is 0.0117") and W' to 0.0127" (from 0.0124") and provides an S:W ratio of 1:10.2 with the unengraved ink-well areas covering 82.9% of the copy image area. The final engraved ink wells will cover about 89.8% of the copy image area. The depth of etching is reduced to 0.0008" (from 0.0010").

Thus, it can be seen that the printing surfaces of FIGS. 4, 8 and 10 not only reduce S and S' to take advantage of the laterally unetched portions of the support areas used for tonal and line work as in FIG. 7 (wider supports are required for the deeper etching of at least some of the tonal work with the inherently greater lateral etching than for the lesser depth etching of line work with corresponding reduced lateral etching), but also take advantage of the increased ink-well surface area and decreased doctor-blade-support surface area to further reduce depth etching (and lateral etching) and thereby permit decreasing the volume of ink-well capacity.

Another significant effect of the reductions in S is the resultant reduction in the width E of the doctor-blade-support surface areas at many of the external intersections between the supports and the edges of the image. That is, the doctor-blade supports in both the tonal work image and the line work image increase in width at many of the intersections of the supports with the edges of the image, but the maximum width of the supports in the line work image is substantially smaller than the maximum width of the supports in the tonal work image (at comparable intersections, i.e., where engraving depth and angle of intersection are comparable). For example, when the width S is reduced from 0.0017" to 0.0012", E is reduced from 0.0024" to 0.0017", which is a 29.2% reduction. Consequently, the continuity and smoothness of the edges of the copy image and the printed reproduction are improved even beyond the improvement effected by the increased well width W described above in connection with FIGS. 3 and 9. There is also a corresponding reduction in the dimension I' of the doctor-blade supports at the internal intersections of the supports; for example, when S' is reduced from 0.0010" to 0.0007", I' is reduced from 0.0014" to 0.0012", which is a 14.3% reduction.

In recent years, techniques have been, and still are being, developed for reducing or even eliminating the lateral etching that normally occurs around the periphery of each ink well in a gravure printing surface. For example, "banking" agents are being developed to prevent or at least minimize the attack of the etching solution on the side walls of the ink wells. However, when these techniques have been utilized to reduce or eliminate lateral etching, the conventional grid patterns of the type illustrated in FIGS. 2 and 7 have been retained, resulting in excessively wide doctor-blade-support areas which still produce the large edge interruptions E of the same magnitude illustrated in FIG. 7. In keeping with the present invention, and as illustrated in FIGS. 5–6 and 11–12, when lateral etching is eliminated, the width S of the doctor-blade-support areas may be reduced further in the line work image. For example, in FIGS. 5 and 11, the width S of the doctor-blade supports 18 (which is equal to S' because of the elimination of lateral etching from the wells 19) is only 0.0007", producing an E and I of only 0.0010". As can be most clearly seen in FIG. 11, this greatly reduces the maximum span of the doctor-blade supports at the edge of the image, resulting in a still further improvement in the continuity and smoothness of the edge of the printed reproduction. The grid pattern of FIG. 11 also reduces the number of the edge intersections by maintaining the same wide grid spacing shown in FIGS. 9 and 10. The grid pattern of FIG. 12 utilizes substantially the same conventional grid spacing as shown in FIGS. 7 and 8, but it will be recognized that the grid pattern of FIG. 12 still provides an improvement by virtue of the reductions in S, E and I.

In FIGS. 5 and 11, the S:W ratio is 1:18.1, and the ink-well areas cover 89.8% of the copy image area. In FIGS. 6 and 12, the S:W ratio is 1:11.7, and the ink-well areas cover 80.2% of the copy image area. In the printing surface of FIGS. 5 and 11, the grid also has a much closer spacing in the tonal work image.

In general, the grid of doctor-blade-support areas in the line work image preferably has not more than about 150 lines per inch and a ratio of doctor-blade-support areas-width/ink-well-area width (S:W) of at least about 1:4, and the ratio of doctor-blade-support width/ink-well width (S':W') is preferably at least about 1:8.5. The unengraved ink-well areas in the line work image also preferably comprise at least about 65%, of the area of the copy image, and the engraved ink wells preferably comprise at least about 80% of the copy image area.

As can be seen from the foregoing detailed description, the present invention satisfies the practical desire of publishers and printers to have a maximum surface of ink wells broken only by a minimum surface of support for the doctor blade. A maximum of type and line shape is available for engraving, a minimum of lateral etching occurs, and the depth of the ink wells is held to the level necessary to permit required ink migration over non-ink-well surface areas. Limiting ink migration reduces the blurriness of the printed reproduction and the magnitude of the serrations along the edges of the printed reproduction. Thus, the continuity and smoothness of the edges of the printed reproduction is significantly improved in the line work, while maintaining a high degree of resolution in the tonal work. In addition to the improvement in printing quality, the invention offers significant economic advantages, particularly in savings of ink.

I claim as my invention:

1. A method of preparing a gravure printing surface or surfaces for reproducing both tonal work and line work on a single printed media, said method comprising the steps of (a) engraving the tonal work image on a printing surface, said image comprising a multiplicity of ink wells separated by a grid of doctor-blade supports with a centerline-to-centerline spacing that provides a high degree of resolution of the tonal work image, (b) and engraving the line work image on a printing surface, said line work image comprising a multiplicity of ink wells separated by a grid of doctor-blade supports with a centerline-to-centerline spacing that is substantially greater than the centerline-to-centerline spacing of said doctor-blade supports for said tonal work to provide a smaller number of intersections between said doctor-blade supports and the edges of the line work image than between said doctor-blade supports and the edges of the tonal work image, thereby to improve the continuity and smoothness of the edges of the line work image.

2. A method of preparing a gravure printing surface or surfaces for printing both tonal work and line work as set forth in claim 1, wherein said grid of doctor-blade supports in said engraved line work image has not more than about 150 lines per inch and a ratio of support width/well width of at least about 1:8.5.

3. A method of preparing a gravure printing surface or surfaces for printing both tonal work and line work as set forth in claim 1, wherein the maximum width of said doctor-blade supports at the intersections of said supports with each other in the line work image and with the edges of the line work image is substantially less than the maximum width of said doctor-blade supports at the comparable intersections of said supports with each other in the tonal work image and with the edges of the tonal work image.

4. A method of preparing a gravure printing surface or surfaces for printing both tonal work and line work as set forth in claim 1, wherein at least certain of the ink wells in said tonal work image are engraved deeper than the ink wells in said line work image.

5. A method of preparing a gravure printing surface or surfaces for printing both tonal work and line work as set forth in claim 1, wherein the ink wells in said line work image have a greater surface area and are engraved more shallow than the ink wells in regions of similar hue in said tonal work image.

6. A method of preparing a gravure printing surface or surfaces for printing both tonal work and line work as set forth in claim 1, wherein the ink wells engraved in said line work image comprise at least about 80% of the area of the line work image.

7. A method of preparing a gravure printing surface or surfaces for printing both tonal work and line work on a single printed media, said method comprising the steps of
   (a) forming the tonal work image on a printing surface, said image comprising a multiplicity of ink-well areas separated by a grid of doctor-blade-support areas of predetermined width to accommodate a high degree of lateral engraving during the engraving of at least some of the ink wells in said tonal work image,
   (b) forming the line work image on a printing surface, said line work image comprising a multiplicity of ink-well areas separated by a grid of doctor-blade-support areas having a substantially smaller width than the doctor-blade-support areas in said tonal work image to increase the quantity of copy image transfer, to improve the continuity of the edges of the copy image transfer, and to reduce the spans between adjacent ink-well areas in the line work image,
   (c) and engraving said ink-well areas in the tonal work image and in the line work image with at least certain of the resulting ink wells in the tonal work image being engraved deeper than the resulting ink wells in the line work image.

8. A method of preparing a gravure printing surface or surfaces for printing both tonal work and line work as set forth in claim 7, wherein the ink-well areas in said line work image have a greater surface area and are engraved to a more shallow depth than the ink-well areas in regions of similar hue in said tonal work image.

9. A method of preparing a gravure printing surface or surfaces for printing both tonal work and line work as set forth in claim 7, wherein said grid of doctor-blade-support areas in said line work image has not more than about 150 lines per inch and a ratio of support-area width/well-area width of at least about 1:4.

10. A method of preparing a gravure printing surface or surfaces for printing both tonal work and line work as set forth in claim 7, wherein the doctor-blade-support areas in said line work image have a centerline-to-centerline spacing substantially greater than the centerline-to-centerline spacing of the doctor-blade-support areas in said tonal work image.

11. A method of preparing a gravure printing surface or surfaces for printing both tonal work and line work as set forth in claim 7, wherein the ink-well areas in said line work image comprise at least about 65% of the area of the line work image.

12. A method of gravure printing both tonal work and line work on a single printed media, said method comprising the steps of
   (a) printing the tonal work with a printing surface comprising a multiplicity of ink wells separated by a grid of doctor-blade supports spaced to provide a high degree of resolution of the tonal work,
   (b) and printing the line work with a printing surface comprising a multiplicity of ink wells separated by a grid of doctor-blade supports having a centerline-to-centerline spacing substantially greater than the centerline-to-centerline spacing of the doctor-blade supports for said tonal work to provide a smaller number of intersections between said doctor-blade supports and the edges of the printed line work than between said doctor-blade supports and the edges of the tonal work image, thereby improving the continuity and smoothness of the edges of the printed line work.

13. A method of gravure printing as set forth in claim 12, wherein said grid of doctor-blade supports for said line work has not more than about 150 lines per inch and a ratio of support-width/well-width of at least about 1:8.5.

14. A method of gravure printing as set forth in claim 12, wherein said doctor-blade supports for said line work have a more narrow width than the doctor-blade supports in at least a portion of the printing surface for said tonal work.

15. A method of gravure printing as set forth in claim 12, wherein the maximum width of said doctor-blade supports for said line work at the intersections of said supports with the edges of the line work image to be printed is substantially less than the maximum width of said doctor-blade supports for regions of comparable hue in said tonal work at the intersections of said supports with the edges of the tonal work image to be printed.

16. A method of gravure printing as set forth in claim 12, wherein at least certain of the ink wells for said tonal work are engraved deeper than the ink wells for said line work.

17. A method of gravure printing as set forth in claim 12, wherein the ink wells for said line work have a greater surface area and are engraved more shallow than the ink wells for regions of similar hue in said tonal work.

18. A method of gravure printing as set forth in claim 12, wherein the ink wells for said line work comprise at least about 80% of the area of the line work image to be printed.

19. A method of gravure printing both tonal work and line work on a single printed media, said method comprising the steps of
   (a) printing the tonal work with a printing surface comprising a multiplicity of ink wells separated by a grid of doctor-blade supports which increase in width at the intersections of said supports with the edges of the tonal work image,
   (b) printing the line work with a printing surface comprising a multiplicity of ink wells separated by a grid of doctor-blade supports which increase in width at the intersections of said supports with the edges of the line work image, the maximum width of said supports in the line work image being substantially smaller than the maximum width of said supports in regions of comparable hue in the tonal work image to improve the continuity and smoothness of the edges of the printed line work and to reduce the spans between adjacent ink wells in said line work image, at least certain of the ink wells in said tonal work image being deeper than the ink wells in said line work image.

20. A method of gravure printing as set forth in claim 19, wherein the ink wells for said line work have a greater surface area and are engraved more shallow than the ink wells for regions of similar hue in said tonal work.

21. A method of gravure printing as set forth in claim 19, wherein said grid of doctor-blade supports for said line work has not more than about 150 lines per inch and a ratio of support width/well width of at least about 1:8.5.

22. A method of gravure printing as set forth in claim 19, wherein the doctor-blade supports for said line work have a centerline-to-centerline spacing substantially greater than the centerline-to-centerline spacing of the doctor-blade supports for said tonal work.

23. A method of gravure printing as set forth in claim 19, wherein the ink wells for said line work comprise at least about 80% of the area of the line work image.

24. A gravure printing surface for printing both tonal work and line work on a single printed media, said printing surface comprising the combination of
 (a) a tonal work image comprising the multiplicity of ink wells separated by a grid of doctor-blade supports having a centerline-to-centerline spacing that provides a high degree of resolution of the tonal work,
 (b) a line work image comprising a multiplicity of ink wells separated by a grid of doctor-blade supports with a centerline-to-centerline spacing substantially greater than the centerline-to-centerline spacing of the doctor-blade supports for said tonal work to provide a smaller number of intersections between said doctor-blade supports and the edges of the printed line work than between said doctor-blade supports and the edges of the printed tonal work and thereby improve the continuity and smoothness of the edges of the printed line work.

25. A gravure printing surface as set forth in claim 24, wherein said grid of doctor-blade supports in said line work image has not more than about 150 lines per inch and a ratio of support width/well width of at least about 1:8.5.

26. A gravure printing surface as set forth in claim 24, wherein said doctor-blade supports in said line work image have a more narrow width than said doctor-blade supports in at least a portion of said tonal work image.

27. A gravure printing surface as set forth in claim 24, wherein the maximum width of said doctor-blade supports at the intersections of said supports with the edges of the line work image is substantially less than the maximum width of said doctor-blade supports at the intersections of said supports with the edges of the tonal work image in regions of comparable hue.

28. A gravure printing surface as set forth in claim 24, wherein at least certain of the ink wells in said tonal work image are engraved deeper than the ink wells in said line work image.

29. A gravure printing surface as set forth in claim 24, wherein the ink wells in said line work image have a greater surface area and are engraved more shallow than the ink wells in regions of similar hue in said tonal work image.

30. A gravure printing surface as set forth in claim 24, wherein the ink wells engraved in said line work image comprise at least about 80% of the area of the line work image.

31. A gravure printing surface for printing both tonal work and line work on a single printed media, said printing surface comprising the combination of
 (a) a tonal work image comprising a multiplicity of ink wells separated by a grid of doctor-blade supports which increase in width at the intersections of said supports with the edges of the tonal work image,
 (b) a line work image comprising a multiplicity of ink wells separated by a grid of doctor-blade supports which increase in width at the intersections of said supports with the edges of the line work image, the maximum width of said supports in said said line work image being substantially smaller than the maximum width of said supports in regions of comparable hue in said tonal work image to improve the continuity and smoothness of the edges of the printed line work and to reduce the spans between adjacent ink wells in the line work image, at least certain of the ink wells in said tonal work image being deeper than the ink wells in said line work image.

32. A gravure printing surface as set forth in claim 31, wherein the ink wells in said line work image have a greater surface area and are engraved more shallow than the ink wells in regions of similar hue in said tonal work image.

33. A gravure printing surface as set forth in claim 31, wherein said grid of doctor-blade supports in said line work image has not more than about 150 lines per inch and a ratio of support width/well width of at least about 1:8.5.

34. A gravure printing surface as set forth in claim 31, wherein the doctor-blade supports in said line work image have a centerline-to-centerline spacing substantially greater than the centerline-to-centerline spacing of the doctor-blade supports in said tonal work image.

35. A gravure printing surface as set forth in claim 31, wherein the ink wells engraved in said line work image comprise at least about 80% of the area of the line work image.

36. A method of preparing a gravure printing surface or surfaces for reproducing both tonal work and line work on a single printed media, said method comprising the steps of
 (a) engraving the tonal work image on a printing surface, said image comprising a multiplicity of ink wells separated by a grid of doctor-blade supports with a centerline-to-centerline spacing that provides a high degree of resolution of the tonal work image,
 (b) and engraving the line work image on a printing surface, said line work image comprising a multiplicity of ink wells separated by a grid of doctor-blade supports having not more than 150 lines per inch, a support width/well width ratio of at least 1:8.5, a substantially narrower width than the doctor-blade supports for at least a portion of said tonal work, a centerline-to-centerline spacing that is substantially greater than the centerline-to-centerline spacing of said doctor-blade supports for said tonal work to provide a smaller number of intersections between said doctor-blade supports and the edges of the line work image than between said doctor-blade supports and the edges of the tonal work image, the ink wells engraved in said line work image comprising at least 80% of the area of the line work image and having a greater surface area and a more shallow depth than the ink wells engraved in regions of similar hue in the tonal work image.

* * * * *